(12) United States Patent
Yanagita et al.

(10) Patent No.: US 10,903,033 B2
(45) Date of Patent: Jan. 26, 2021

(54) ELECTRONIC MODULE

(71) Applicant: Sumitomo Wiring Systems, Ltd., Mie (JP)

(72) Inventors: Yoshiki Yanagita, Mie (JP); Takumi Ejima, Mie (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 16/740,648

(22) Filed: Jan. 13, 2020

(65) Prior Publication Data

US 2020/0273654 A1     Aug. 27, 2020

(30) Foreign Application Priority Data

Feb. 25, 2019  (JP) ................. 2019-031846

(51) Int. Cl.
| | | |
|---|---|---|
| *B60R 16/023* | (2006.01) | |
| *H01H 85/20* | (2006.01) | |
| *B60R 16/03* | (2006.01) | |
| *H02B 1/46* | (2006.01) | |
| *H01R 4/58* | (2006.01) | |

(52) U.S. Cl.
CPC ....... *H01H 85/205* (2013.01); *B60R 16/0239* (2013.01); *B60R 16/03* (2013.01); *H01R 4/58* (2013.01); *H02B 1/46* (2013.01)

(58) Field of Classification Search
CPC .................................... B60R 16/0239
See application file for complete search history.

(56) References Cited

U.S. PATENT DOCUMENTS

2019/0305471 A1* 10/2019 Kawamura ............ H01R 13/41

FOREIGN PATENT DOCUMENTS

JP       2014-079093 A    5/2014

* cited by examiner

*Primary Examiner* — Hung V Ngo
(74) *Attorney, Agent, or Firm* — Honigman LLP

(57) ABSTRACT

An electronic module is an electronic module for a vehicle, including a casing that has a through hole in communication with the inside and the outside of the casing and a bus bar includes a strip-shaped connection terminal to be fitted into a connector of a fuse, the connection terminal includes one end portion in its longitudinal direction exposed to the outside of the casing. The casing has a first flat surface in a peripheral edge portion of the insertion hole, on the inner side of the casing, the connection terminal includes an extension portion that is located on another end side in the longitudinal direction with respect to the one end portion and extends in a width direction of the connection terminal, and the extension portion has a second flat surface that comes into contact with the first flat surface from the inner side of the casing.

2 Claims, 8 Drawing Sheets

ELECTRONIC MODULE

CROSS-REFERENCE TO RELATED APPLICATIONS

This application claims priority of Japanese Patent Application No. JP 2019-031846 filed on Feb. 25, 2019, the contents of which are incorporated herein.

TECHNICAL FIELD

The present disclosure relates to a vehicle electronic module that includes a casing and a bus bar.

BACKGROUND

Conventionally, an electronic module that includes a casing to which electronic components such as a relay are attached is mounted on a vehicle.

JP 2014-79093A discloses a power supply device in which a contact of a relay is electrically connected to a bus bar and the bus bar is provided with a heat dissipation mechanism, and thus the bus bar can be used as both a current path and a heat dissipation path and the heat dissipation properties of the relay can be improved.

In some cases, a fuse is connected to a bus bar that is included in an electronic module. In such an electronic module, an insertion hole is provided in a top plate of the casing, for example. The bus bar includes a strip-shaped connection terminal. The connection terminal of the bus bar is passed through the insertion hole such that one end portion of the connection terminal in its longitudinal direction is exposed to the outside of the casing.

The fuse includes a female connector. The bus bar and the fuse are connected to each other by fitting the end portion of the connection terminal of the bus bar, which is exposed from the casing, into the connector of the fuse.

If the fuse is blown out, a worker removes the fuse from the bus bar by pulling off the fuse in the longitudinal direction of the connection terminal of the bus bar. Then, the worker connects a new fuse to the bus bar.

JP 2014-79093A is an example of related art.

SUMMARY

The bus bar described in JP 2014-79093A is screwed to the casing.

However, there are cases in which the bus bar is not fixed to the casing for the sake of convenience of assembly of the electronic module or so that the electronic module can follow deformation due to a temperature change when in use.

In this case, if the worker pulls off a blown fuse in order to replace the fuse, the bus bar wobbles as the fuse is pulled off. As a result, the fuse cannot be smoothly removed from the bus bar, and therefore workability is poor.

The present disclosure has been made in view of the above circumstances, and it is an object of the disclosure to provide a vehicle electronic module that includes a casing and a bus bar and can improve workability at the time of replacing a fuse connected to the bus bar.

An electronic module according to an embodiment of the present disclosure is an electronic module for a vehicle, including a casing that has a through hole that is in communication with the inside and the outside of the casing and a bus bar that includes a strip-shaped connection terminal to be fitted into a connector of a fuse, the connection terminal including one end portion in its longitudinal direction that is exposed to the outside of the casing as a result of being passed through the through hole, wherein the casing has a first flat surface in a peripheral edge portion of the insertion hole, on the inner side of the casing, the connection terminal includes an extension portion that is located on another end side in the longitudinal direction with respect to the one end portion and extends in a width direction of the connection terminal, and the extension portion has a second flat surface that comes into contact with the first flat surface from the inner side of the casing.

According to the present disclosure, it is possible to improve workability at the time of replacing a fuse that is connected to a bus bar in a vehicle electronic module that includes a casing and the bus bar.

DETAILED DESCRIPTION OF PREFERRED EMBODIMENTS

Figure 1:
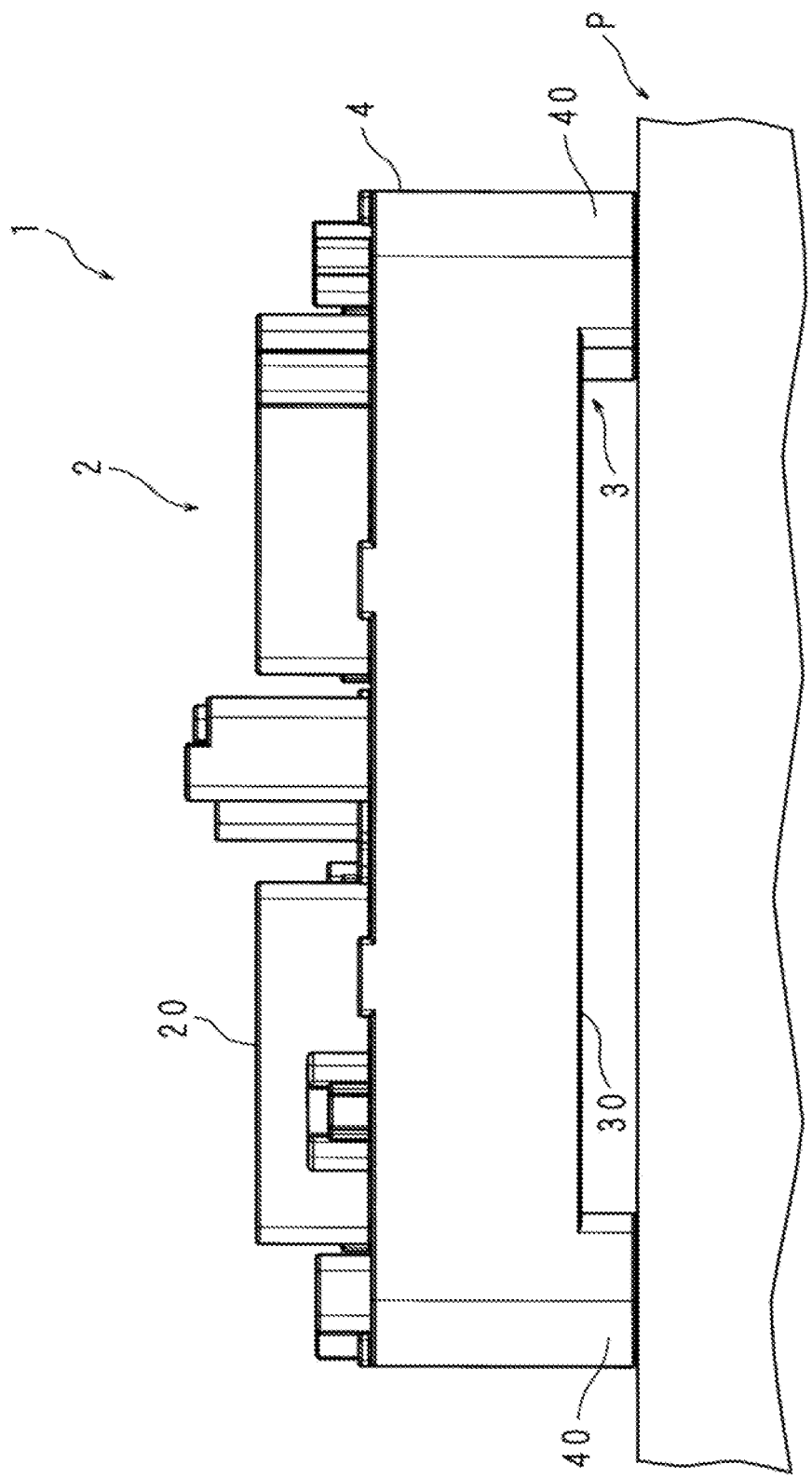
FIG. 1 is a side view showing an electronic module according to Embodiment 1.

First, embodiments of the present disclosure will be listed and described. At least some of the embodiments described below may be combined freely.

An electronic module according to an embodiment of the present disclosure is an electronic module for a vehicle, including a casing that has a through hole that is in communication with the inside and the outside of the casing and a bus bar that includes a strip-shaped connection terminal to be fitted into a connector of a fuse, the connection terminal including one end portion in its longitudinal direction that is exposed to the outside of the casing as a result of being passed through the through hole, wherein the casing has a first flat surface in a peripheral edge portion of the insertion hole, on the inner side of the casing, the connection terminal includes an extension portion that is located on another end side in the longitudinal direction with respect to the one end portion and extends in a width direction of the connection terminal, and the extension portion has a second flat surface that comes into contact with the first flat surface from the inner side of the casing.

In this embodiment, the casing has the through hole that is in communication with the inside and the outside of the casing.

The bus bar includes the strip-shaped connection terminal. The one end portion of the connection terminal in its longitudinal direction is exposed to the outside of the casing as a result of being passed through the through hole. The bus bar and the fuse are connected to each other by fitting the one end portion of the connection terminal into the connector of the fuse.

When the fuse is to be replaced, the fuse is pulled off in the longitudinal direction of the connection terminal of the bus bar and thus removed from the bus bar.

The first flat surface is provided in the peripheral edge portion of the insertion hole, on the inner side of the casing. The connection terminal of the bus bar includes the extension portion that extends in the width direction of the connection terminal. The extension portion has the second flat surface that comes into contact with the first flat surface of the casing from the inner side of the casing, and therefore the bus bar can be kept from wobbling when the fuse is pulled off to be replaced. As a result, the fuse can be smoothly removed from the bus bar.

Thus, workability at the time of replacing the fuse can be improved.

In an electronic module according to an embodiment of the present disclosure, the extension portion is provided on each side of the connection terminal in the width direction, a support portion that includes two recesses in which the two extension portions are fitted is provided in the peripheral edge portion so as to protrude toward the inner side of the casing, and the two recesses each have the first flat surface and inner surfaces that come into contact with opposite surfaces of a corresponding one of the extension portions.

In this embodiment, on the opposite sides of the connection terminal of the bus bar in its width direction, two second flat surfaces respectively come into contact with two first flat surfaces, and therefore wobbling of the bus bar can be further suppressed when the fuse is pulled off to be replaced.

Furthermore, the two extension portions of the connection terminal of the bus bar are fitted in the two recesses of the support portion provided on the casing, and therefore wobbling of the bus bar in the thickness direction of the connection terminal can be suppressed.

In an electronic module according to an embodiment of the present disclosure, each extension portion has a rectangular shape, each extension portion spans from an intermediate portion of the connection terminal in its longitudinal direction to another end of the connection terminal in its longitudinal direction, and a corner portion of each extension portion that is adjacent to the second flat surface in an extension direction is chamfered.

In this embodiment, the corner portion of the extension portion is chamfered, and therefore the appearance of the bus bar can be improved. Furthermore, the corner portion of the extension portion does not interfere with a peripheral edge portion of the recess of the casing, and therefore the extension portion can be easily fitted into the recess.

In an electronic module according to an embodiment of the present disclosure, the extension portion is provided at an intermediate portion of the connection terminal in its longitudinal direction.

In this embodiment, the extension portion is provided at the intermediate portion of the connection terminal in its longitudinal direction, and therefore the amount of a material used for providing the connection terminal with the extension portion can be reduced. As a result, the weight of the bus bar can be reduced.

Electronic modules according to embodiments of the present disclosure will be described below with reference to the drawings. Note that the present disclosure is not limited to these examples, but is defined by the claims, and is intended to encompass all modifications within the meanings and scope that are equivalent to the claims.

Embodiment 1

In the present embodiment described below, an exemplary vehicle electronic module to which, for example, a relay is attached as an electronic component will be described.

FIG. 1 is a side view showing an electronic module 1 according to Embodiment 1. The electronic module 1 is attached to an outer side of a battery pack P of an electric vehicle (EV), for example. The electronic module 1 includes a casing 2. On an outer surface of the casing 2, an attachment portion 20 is provided for attaching, to the casing 2, a relay (not shown) that is switched on in a state in which the vehicle is caused to travel, and is switched off in a state in which the vehicle is not caused to travel.

The casing 2 is made of ZYLON (registered trademark), for example, and includes a lower case 3 and an upper case 4 that covers the lower case 3. That is, the electronic module 1 according to the present embodiment is attached such that a bottom plate 30 of the lower case 3 faces the battery pack P. More specifically, a leg portion 40 having a bottomed tubular shape is provided at each of the four corners of the upper case 4, and a through hole (not shown) is formed in the bottom of each of the leg portions 40. The electronic module 1 can be attached to the battery pack P by, for example, passing screws through the through holes of the leg portions 40, and threadably engaging the screws with the battery pack P.

For the sake of convenience of the following description, in the direction in which the electronic module 1 and the battery pack P face each other, the electronic module 1 side will be referred to as the upper side, and the battery pack P side will be referred to as the lower side.

Figure 2:
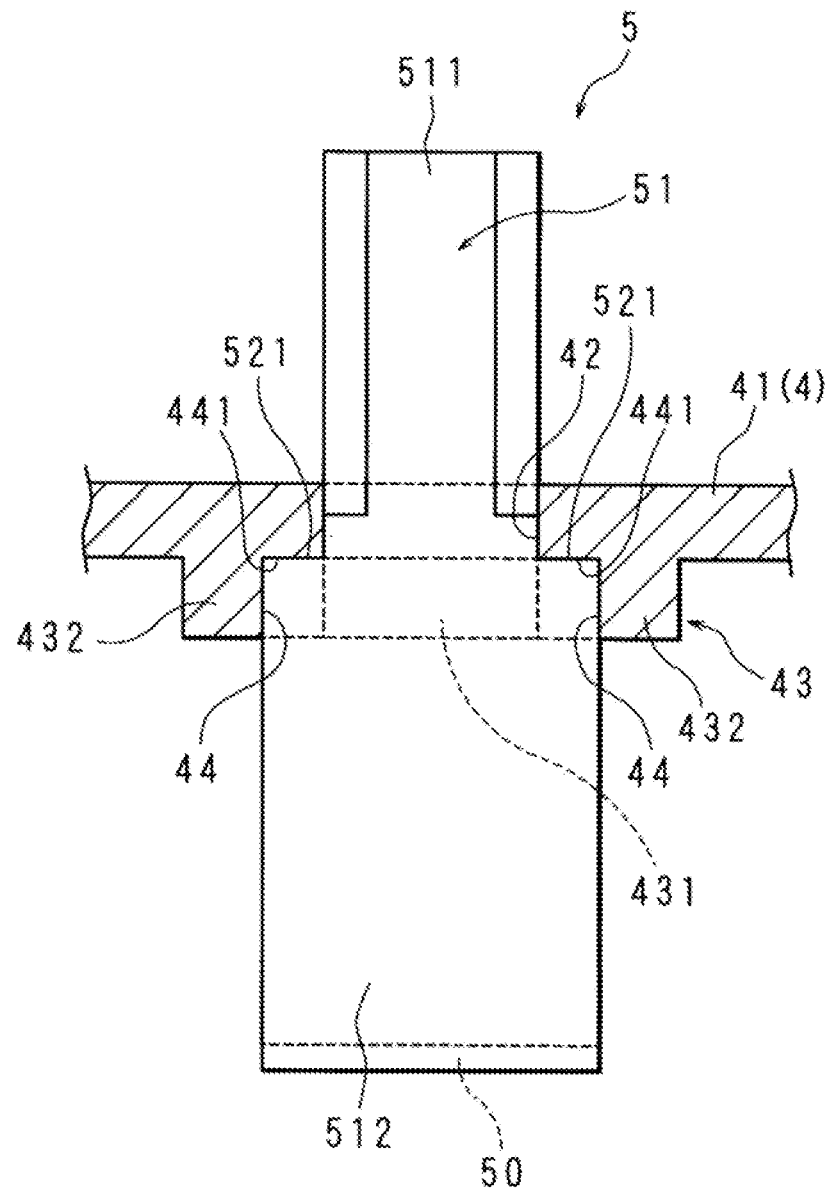
FIG. 2 is a cross-sectional view showing a part of a top plate of an upper case of the electronic module according to Embodiment 1.

FIG. 2 is a cross-sectional view showing a part of a top plate 41 of the upper case 4 of the electronic module 1 according to Embodiment 1.

Figure 3:
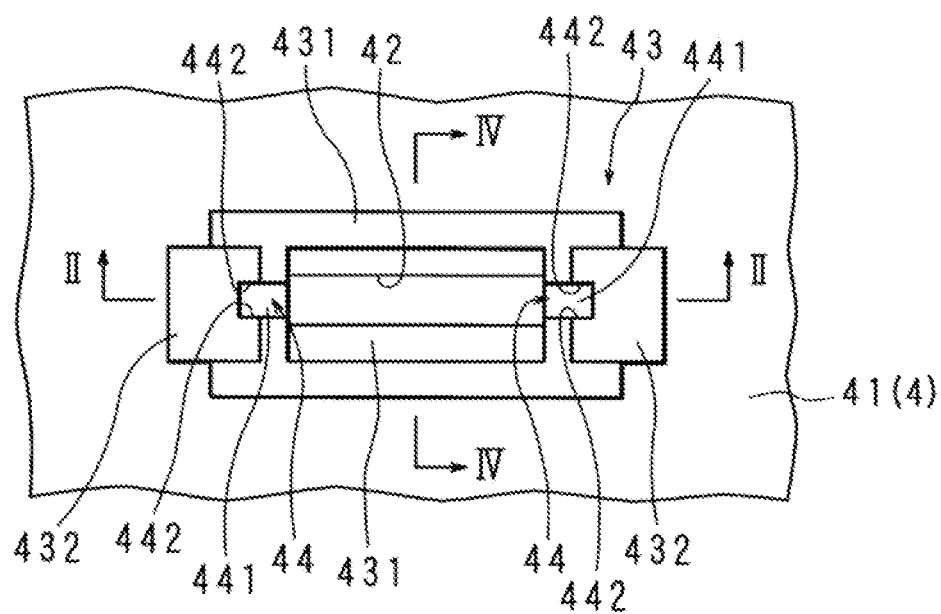
FIG. 3 is a bottom view showing a part of the top plate of the upper case of the electronic module according to Embodiment 1.

FIG. 3 is a bottom view showing a part of the top plate 41 of the upper case 4 of the electronic module 1 according to Embodiment 1.

Figure 4:
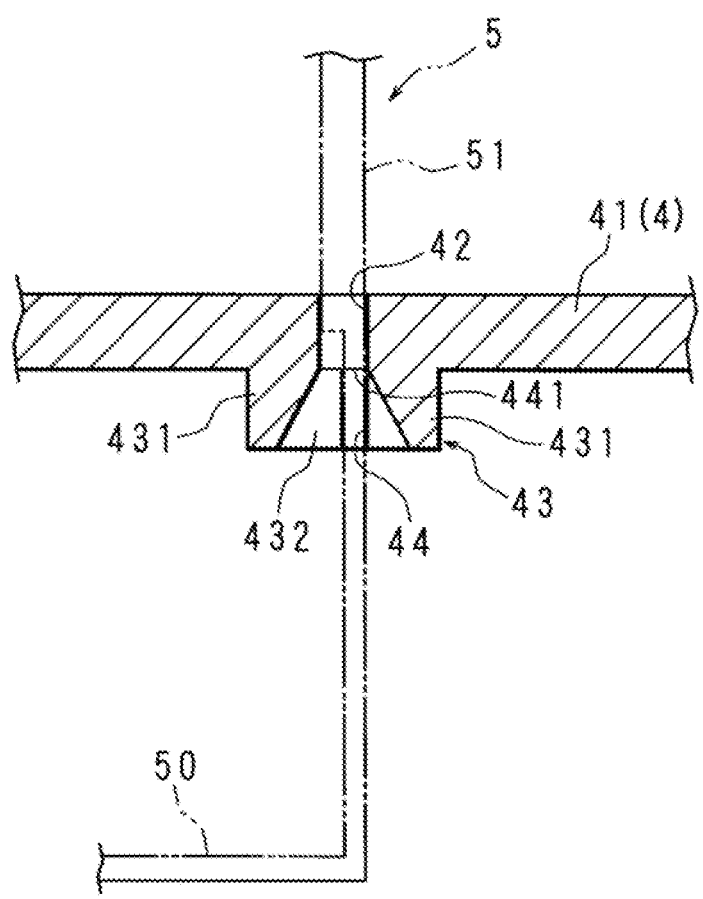
FIG. 4 is a cross-sectional view of the top plate of the upper case of the electronic module taken along line IV-IV in FIG. 3.

FIG. 4 is a cross-sectional view of the top plate 41 of the upper case 4 of the electronic module 1 taken along line IV-IV in FIG. 3.

FIG. 2 is also a cross-sectional view of the top plate 41 taken along line II-II in FIG. 3. FIGS. 2 and 3 show the vicinity of an insertion hole 42, which will be described later.

As shown in FIGS. 2 and 4, the top plate 41 of the upper case 4 has an appropriate thickness. As shown in FIGS. 2 to 4, the insertion hole 42 is provided in the top plate 41.

The insertion hole 42 is in communication with the inside and the outside of the upper case 4. The insertion hole 42 has a rectangular shape that is elongated in one direction.

In the following description, the direction extending along long sides of the insertion hole 42 (i.e., the left-right direction in FIGS. 2 and 3) will be referred to as the left-right direction, and the direction extending along short sides of the insertion hole 42 (i.e., the left-right direction in FIG. 4) will be referred to as the front-rear direction. The upper side and the lower side of the top plate 41 in FIGS. 2 and 4 are the outer side and the inner side of the upper case 4, respectively.

On the inner side of the upper case 4, a support portion 43 is provided in a peripheral edge portion of the insertion hole 42 of the top plate 41. The support portion 43 includes two wall members 431 that are arranged along the two long sides of the insertion hole 42 and two blocks 432 that are arranged so as to face the two short sides of the insertion hole 42. The wall members 431 and the blocks 432 protrude downward from the inner surface of the top plate 41.

Inner surfaces of the two wall members 431 are inclined such that a space between the inner surfaces is tapered and becomes narrow in the front-rear direction from the lower ends of the wall members 431 to the lower end of the insertion hole 42 (the upper ends of the wall members 431).

The two blocks 432 are located at the left end and the right end of the insertion hole 42, respectively. Each block 432 is provided with a groove-shaped recess 44 that extends in the left-right direction. Each recess 44 has a bottom surface 441 that serves as a first flat surface. A right end portion (left end portion) of the recess 44 in the left-side (right-side) block 432 is open.

Figure 5:
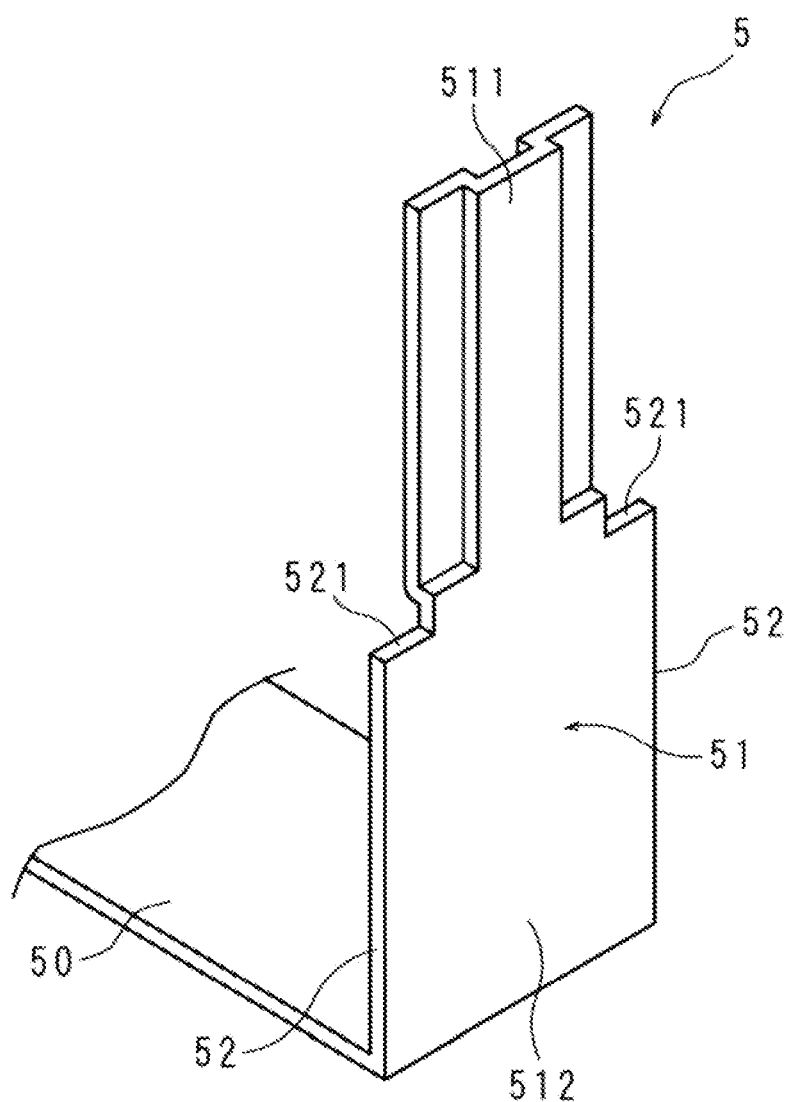
FIG. 5 is a perspective view showing a connection terminal of a bus bar included in the electronic module according to Embodiment 1.

FIG. 5 is a perspective view showing a connection terminal 51 of a bus bar 5 that is included in the electronic module 1 according to Embodiment 1.

As shown in FIGS. 2 and 5, the bus bar 5 includes a bus bar main body 50 and the connection terminal 51.

The bus bar main body 50 has a plate-like shape. The connection terminal 51 stands upright at a peripheral edge portion of the bus bar main body 50.

The connection terminal 51 has a strip-like shape. In FIG. 2, one end portion of the connection terminal 51 in its longitudinal direction protrudes upward from the top plate 41. In the following description, the one end portion and the other end portion of the connection terminal 51 in its longitudinal direction will be referred to as an upper end portion 511 and a lower end portion 512, respectively. The lower end portion 512 of the connection terminal 51 and the bus bar main body 50 are formed as a single piece.

In the approximately upper half portion of the connection terminal 51, both end portions of the connection terminal 51 in its width direction are recessed in the same direction through pressing.

The connection terminal 51 includes two extension portions 52. The two extension portions 52 are provided on opposite sides of the connection terminal 51 in its width direction. Each extension portion 52 has a rectangular shape. Each extension portion 52 spans the entire length of the lower half of the connection terminal 51 and is flush with the lower half of the connection terminal 51. The bus bar main body 50 spans the two extension portions 52 of the connection terminal 51. Each extension portion 52 has an upper end surface 521 that serves as a second flat surface.

As shown in FIGS. 2 and 4, the connection terminal 51 of the bus bar 5 is passed through the insertion hole 42 of the top plate 41, and the upper end portion 511 of the connection terminal 51 is exposed to the upper side of the upper case 4. The two extension portions 52 are arranged in the left-right direction. The two extension portions 52 are fitted in the two recesses 44, respectively. Two inner surfaces 442 (see FIG. 3) of each recess 44 that face each other in the front-rear direction come into contact with opposite surfaces of the extension portion 52 in the front-rear direction. The upper end surface 521 of the extension portion 52 comes into contact with the bottom surface 441 of the recess 44 from below.

When assembling the electronic module 1, the connection terminal 51 is passed through the insertion hole 42 of the top plate 41 from the inside to the outside of the upper case 4. A space surrounded by the support portion 43 becomes narrow in the direction from the inside to the outside of the upper case 4, and the connection terminal 51 is passed while being guided by the inner surfaces of the two wall members 431 of the support portion 43, and therefore the connection terminal 51 can be easily passed through the through hole 42.

The bus bar 5 is positioned as a result of being passed through the through hole 42, but is not screwed to the casing 2, for example. Therefore, the position of the bus bar 5 can be adjusted to some extent when assembling the electronic module 1. Also, deformation of the bus bar 5 due to a temperature change during use of the electronic module 1 can be absorbed to some extent through displacement of the bus bar 5.

A fuse (not shown) is connected to the bus bar 5. The bus bar 5 and the fuse are connected to each other by fitting the upper end portion 511 of the connection terminal 51 of the bus bar 5 into a female connector (not shown) of the fuse.

If the fuse is blown out, a worker removes the fuse from the connection terminal 51 of the bus bar 5 by pulling the fuse upward.

When removing the fuse, an upward external force is applied to the connection terminal 51 of the bus bar 5 due to friction between the connector of the fuse and the connection terminal 51. However, wobbling of the bus bar 5 can be suppressed as a result of the upper end surfaces 521 of the two extension portions 52 coming into contact with the bottom surfaces 441 of the recesses 44 from below. Therefore, the fuse can be smoothly removed from the bus bar 5.

Thus, workability at the time of replacing the fuse can be improved.

Furthermore, the two extension portions 52 of the bus bar 5 are fitted in the two recesses 44 of the support portion 43 provided on the upper case 4, and therefore wobbling of the bus bar 5 in the thickness direction of the connection terminal 51 can be suppressed.

Note that a configuration is also possible in which the support portion 43 is not provided. In this case, the inner surface of the top plate 41 of the upper case 4 may be used as the first flat surface.

A configuration is also possible in which only one of the two extension portions 52 is provided, but if the bus bar 5 is provided with the two extension portions 52, wobbling of the bus bar 5 can be further suppressed, when compared to a case in which the bus bar 5 is provided with only one extension portion 52.

Next, Embodiments 2 and 3 will be described. Electronic modules 1 according to Embodiments 2 and 3 are substantially similar to the electronic module 1 according to Embodiment 1. The electronic modules 1 according to Embodiments 2 and 3 have functions and effects that are substantially similar to those of the electronic module 1 according to Embodiment 1. The following describes differences from Embodiment 1, and constitutional elements that are the same as those in Embodiment 1 are denoted with the same reference numerals as those used in Embodiment 1, and a description thereof is omitted.

Embodiment 2

Figure 6:
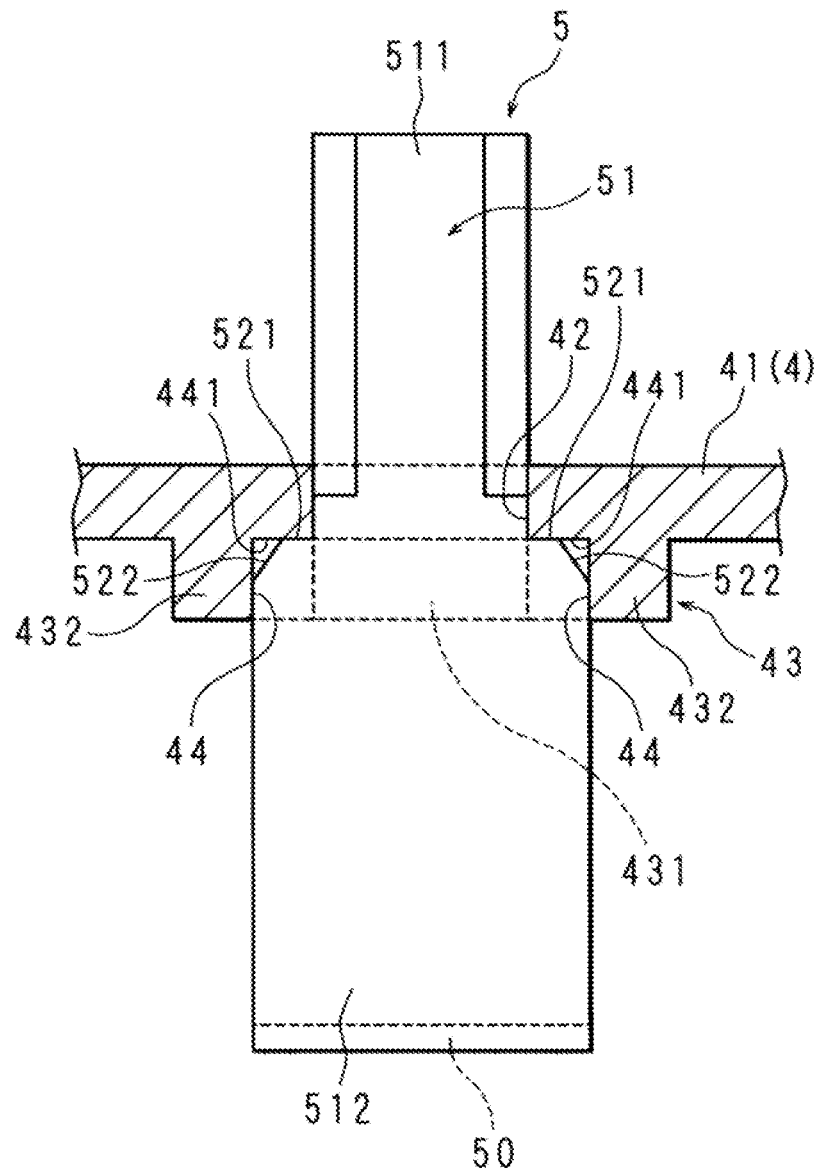
FIG. 6 is a cross-sectional view showing a part of a top plate of an upper case of an electronic module according to Embodiment 2.

FIG. 6 is a cross-sectional view showing a part of the top plate 41 of the upper case 4 of the electronic module 1 according to Embodiment 2. FIG. 6 shows the vicinity of the insertion hole 42.

Figure 7:
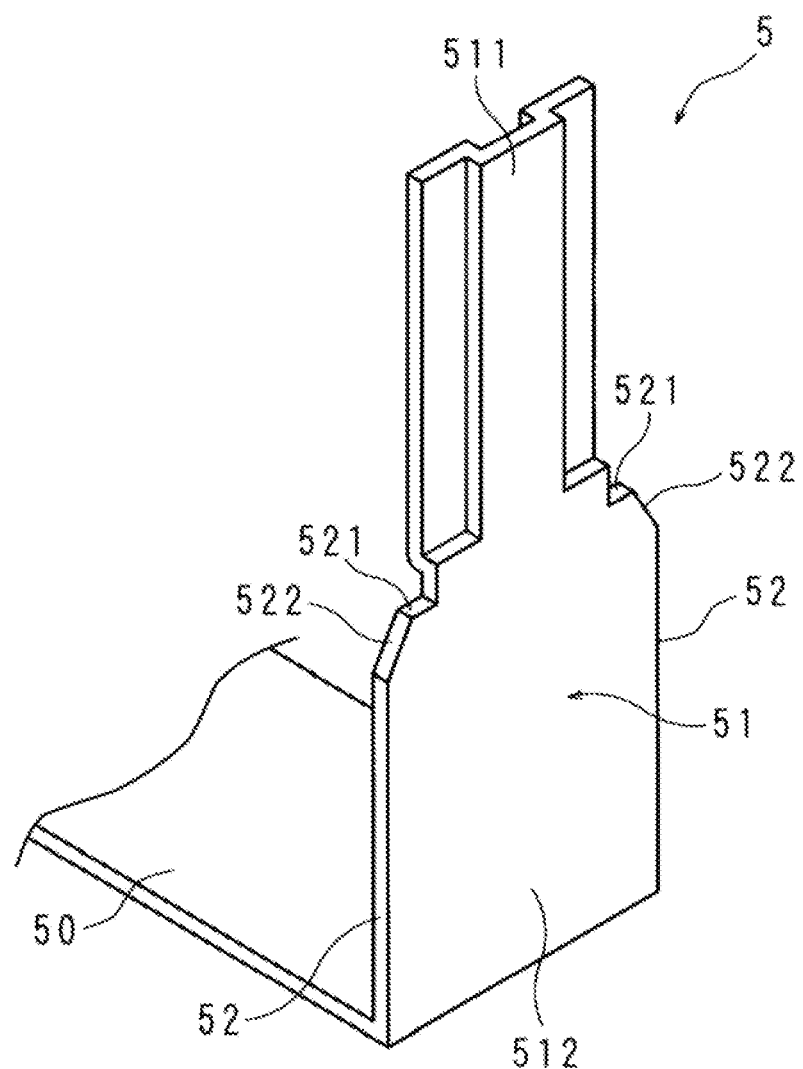
FIG. 7 is a perspective view showing a connection terminal of a bus bar included in the electronic module according to Embodiment 2.

FIG. 7 is a perspective view showing the connection terminal 51 of the bus bar 5 included in the electronic module 1 according to Embodiment 2.

An upper left (upper right) corner portion of the left-side (right-side) extension portion 52 of the connection terminal 51 of the bus bar 5 is chamfered. In the present embodiment, C-chamfering is performed on the corner portion of each extension portion 52. Accordingly, a C surface 522 that is adjacent to the upper end surface 521 in the extension direction of the extension portion 52 is provided in an upper end portion of each extension portion 52.

As a result of the corner portions of the extension portions 52 being chamfered, the appearance of the bus bar 5 is improved.

Note that R-chamfering may also be performed on the corner portions of the extension portions 52. In this case, an R surface that is adjacent to the upper end surface 521 in the extension direction of the extension portion 52 is provided in the upper end portion of each extension portion 52.

When fitting the extension portions 52 into the recesses 44, the corner portions of the extension portions 52 do not interfere with peripheral edge portions of the recesses 44, and therefore the extension portions 52 can be easily fitted into the recesses 44. That is, the electronic module 1 can be easily assembled.

Embodiment 3

Figure 8:
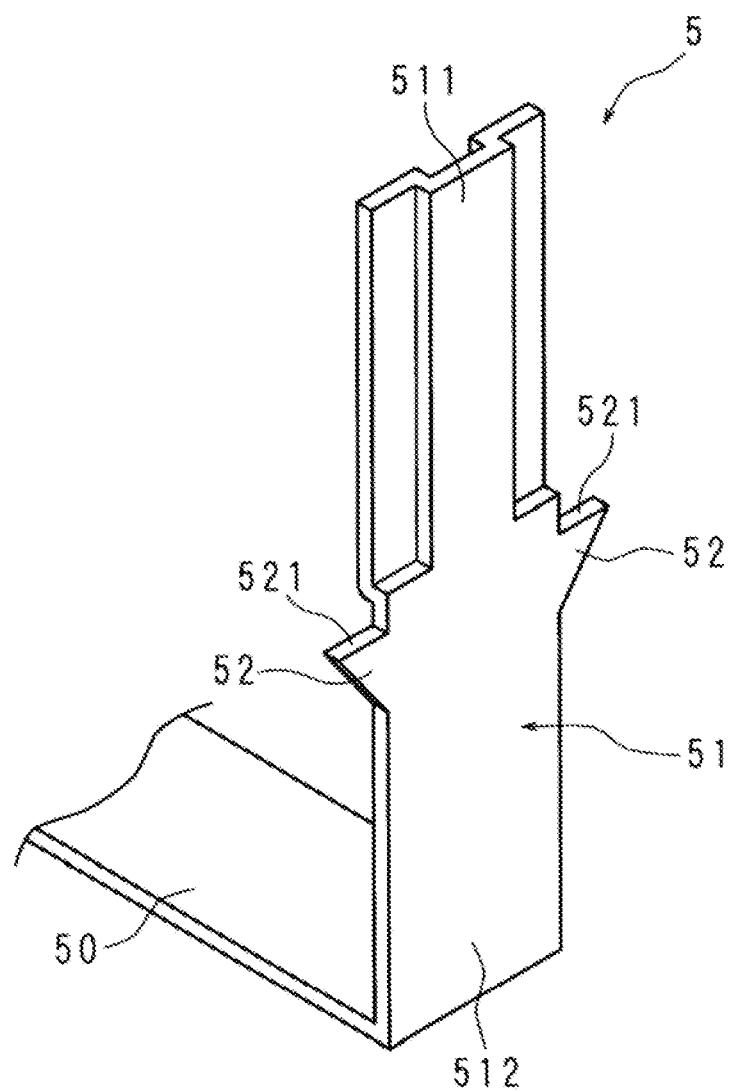
FIG. 8 is a perspective view showing a connection terminal of a bus bar included in an electronic module according to Embodiment 3.

FIG. 8 is a perspective view showing the connection terminal 51 of the bus bar 5 included in the electronic module 1 according to Embodiment 3.

Each extension portion 52 of the connection terminal 51 of the bus bar 5 has the shape of a right triangle and is provided at an intermediate portion of the connection terminal 51 in its longitudinal direction. Out of the two sides of the extension portion 52 excluding the hypotenuse, one side corresponds to the upper end surface 521 and the other side is continuous to the connection terminal 51.

The bus bar main body 50 spans the entire width of the connection terminal 51.

With this configuration, the amount of a material that is used for providing the bus bar 5 with the two extension portions 52 and the bus bar main body 50 can be reduced. As a result, the weight of the bus bar 5 can be reduced.

Note that the shape of each extension portion 52 is not limited to a right triangle, and may be a rectangle, for example.

What is claimed is:

1. An electronic module for a vehicle, comprising:
   a casing that has a through hole that is in communication with the inside and the outside of the casing; and
   a bus bar that includes a strip-shaped connection terminal to be fitted into a connector of a fuse, the connection terminal including one end portion in its longitudinal direction that is exposed to the outside of the casing as a result of being passed through the through hole,
   wherein the casing has a first flat surface in a peripheral edge portion of the insertion hole, on the inner side of the casing,
   the connection terminal includes an extension portion that is located on another end side in the longitudinal direction with respect to the one end portion and extends in a width direction of the connection terminal, and
   the extension portion has a second flat surface that comes into contact with the first flat surface from the inner side of the casing, wherein the extension portion is provided on each side of the connection terminal in the width direction,
   a support portion that includes two recesses in which the two extension portions are fitted is provided in the peripheral edge portion so as to protrude toward the inner side of the casing, and
   the two recesses each have the first flat surface and inner surfaces that come into contact with opposite surfaces of a corresponding one of the extension portions, and
   wherein each extension portion has a rectangular shape,
   each extension portion spans from an intermediate portion of the connection terminal in its longitudinal direction to another end of the connection terminal in its longitudinal direction, and
   a corner portion of each extension portion that is adjacent to the second flat surface in an extension direction is chamfered.

2. The electronic module according to claim 1, wherein the extension portion is provided at an intermediate portion of the connection terminal in its longitudinal direction.

* * * * *